United States Patent [19]

Kobayashi et al.

[11] Patent Number: 5,396,091
[45] Date of Patent: Mar. 7, 1995

[54] SOLID-STATE IMAGE SENSING DEVICE CAPABLE OF READING TWO-LINE SIGNAL CHARGES INDEPENDENTLY

[75] Inventors: Miho Kobayashi; Tomoaki Iizuka, both of Yokohama; Hideki Motoyama, Chigasaki; Tetsuo Yamada; Kenichi Arakawa, both of Yokohama; Nobusuke Sasano, Tokyo, all of Japan

[73] Assignee: Kabushiki Kaisha Toshiba, Kanagawa, Japan

[21] Appl. No.: 195,167

[22] Filed: Feb. 14, 1994

[30] Foreign Application Priority Data

Feb. 15, 1993 [JP] Japan .................................. 5-047118

[51] Int. Cl.⁶ .................... H01L 29/78; H01L 27/14; H01L 31/00
[52] U.S. Cl. .................................. 257/241; 257/232; 257/233; 257/239; 257/240; 348/297; 348/320
[58] Field of Search ............... 257/232, 233, 239, 241, 257/240; 358/213.23, 213.27, 213.29, 213.31

[56] References Cited

U.S. PATENT DOCUMENTS 5,148,013 9/1992 Yamada .

Primary Examiner—Ngan V. Ngo
Attorney, Agent, or Firm—Finnegan, Henderson, Farabow, Garrett & Dunner

[57] ABSTRACT

Solid-state image sensing device is provided with a synthesizing section for synthesizing odd-field signal charges and even-field signal charges. The synthesizing section is a transfer path formed outside of the photosensitive region or vertical transfer paths formed in the photosensitive region. For the signal charge synthesis through vertical transfer path, after the integration, the signal charges are read simultaneously from the odd-line pixel group and the even-line pixel group. Further, it is possible to select either the method of outputting the odd-field signal charges and the even-field signal charges separately or the method of outputting the synthesized odd- and even-field signal charges.

1 Claim, 5 Drawing Sheets

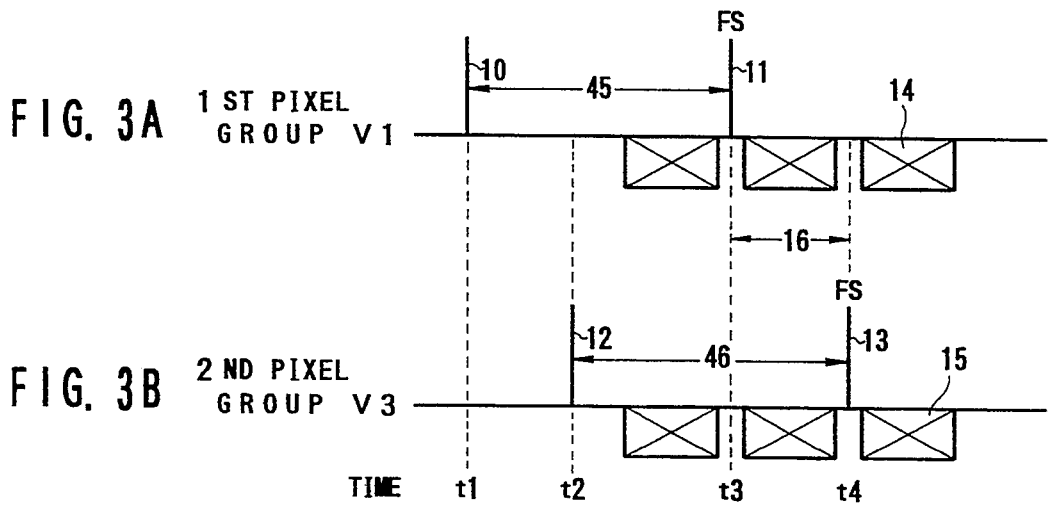
FIG. 3A 1ST PIXEL GROUP V1
FIG. 3B 2ND PIXEL GROUP V3
FIG. 3C TIMING
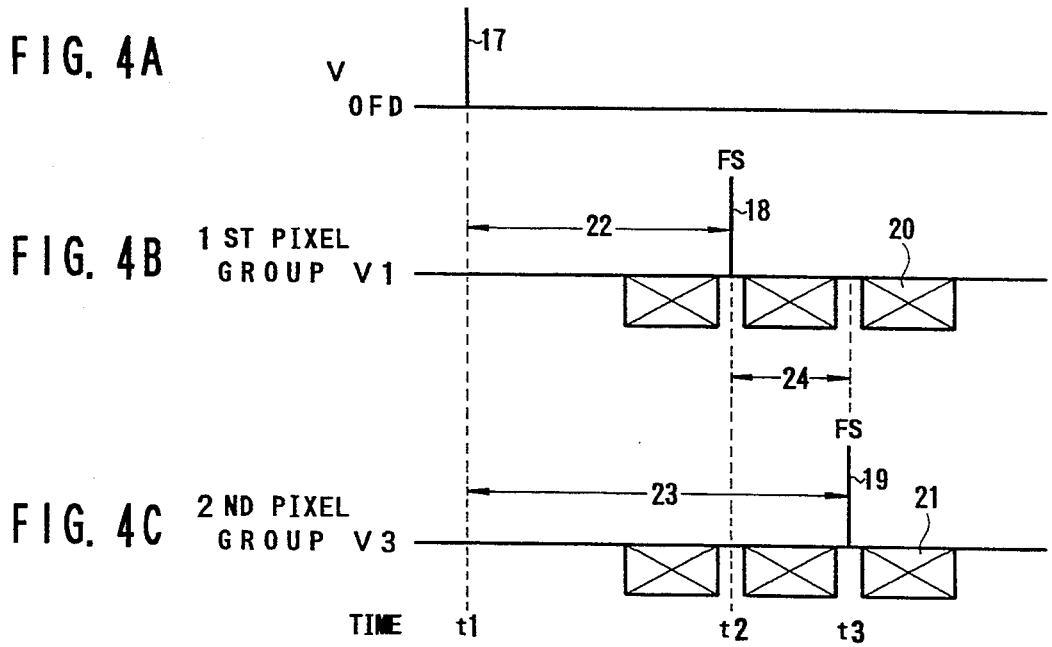
FIG. 4A V OFD
FIG. 4B 1ST PIXEL GROUP V1
FIG. 4C 2ND PIXEL GROUP V3
FIG. 4D TIMING

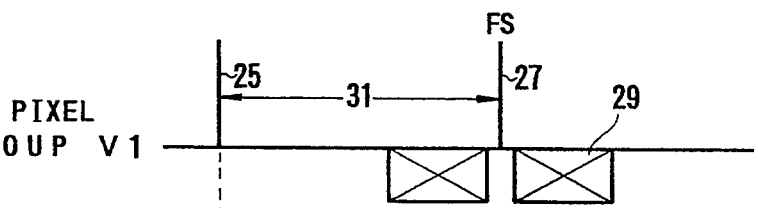
FIG. 7A 1ST PIXEL GROUP V1
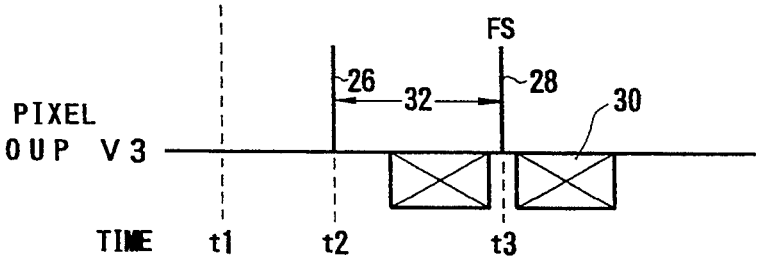
FIG. 7B 2ND PIXEL GROUP V3
FIG. 7C TIMING
FIG. 8A V OFD
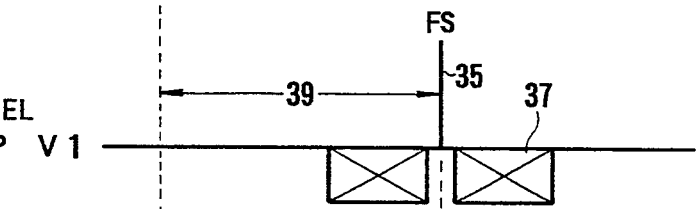
FIG. 8B 1ST PIXEL GROUP V1
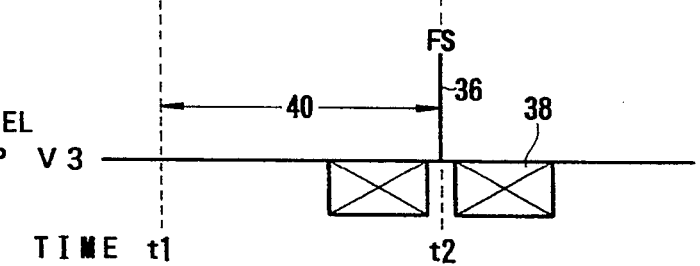
FIG. 8C 2ND PIXEL GROUP V3
FIG. 8D TIMING

SOLID-STATE IMAGE SENSING DEVICE CAPABLE OF READING TWO-LINE SIGNAL CHARGES INDEPENDENTLY

BACKGROUND OF THE INVENTION

1. Field of the Invention

The present invention relates to a solid-state image sensing device and a method of driving the same image sensing device, and more specifically to a solid-state image sensing device having field memories adjoining a photosensitive region and being capable of reading two-line signal charges independently.

2. Description of the Prior Art

Among the solid-state image sensing devices of charge transfer type, a CCD area sensor, for instance, can obtain high resolution video signals, so that this sensor is widely used in broadcasting CCDs, high picture quality CCDs, electronic still camera CCDs, etc.

In the conventional solid-state image sensing device used as an area sensor which can read two-line image signals simultaneously, a first accumulation region and a second accumulation region are formed on both sides of a photosensitive region as field memories. Further, in at least one of the accumulation regions, a cyclic transfer path where a plurality of transfer stages are connected into a loop circuit is provided so that the arrangement sequence of photosensitive elements (pixels) can be changed. The signal charges accumulated in these accumulation regions are transferred along a first horizontal transfer path and a second horizontal transfer path, respectively and further detected by a first charge detecting circuit and a second charge detecting circuit both provided at the transfer ends, respectively. Thus, in general, the signal information (charges) of all the vertical pixels can be obtained within a single field period.

In the above-mentioned structure of the conventional solid-state image sensing device, after a first integration time setting pulse has been applied, in response to a first field shift (FS) pulse, signal charges are read from photosensitive pixels of odd ordinal numbers $(2n-1)$ $(n=1, 2, \ldots)$ counted from above in the vertical direction of the photosensitive region, and the read signal charges are transferred to the first accumulation region in response to a first field transfer pulse. Further, after a second integration time setting pulse has been applied, in response to a second field shift (FS) pulse, signal charges are read from photosensitive pixels of even ordinal numbers $2n$ $(n=1, 2, \ldots)$ counted from above in the vertical direction of the photosensitive region, and the read signal charges are transferred to the second accumulation region in response to a second field transfer pulse. In the case of the above-mentioned transfer, there exists a time difference between the first and second FS pulses, which is equal to a time difference between the first and second integration time setting pulses. The influence of this time difference cannot be disregarded when the signal charge accumulation time (integration time) becomes shorter than a predetermined value.

Further, in the case of the solid-state image sensing device of such a type that all the charges are swept off to the semiconductor substrate prior to the integration start, after an integration time setting pulse has been first applied to the semiconductor substrate, in response to a first field shift (FS) pulse, signal charges are read from photosensitive pixels of odd ordinal numbers $(2n-1)$ $(n=1, 2, \ldots)$ counted from above in the vertical direction of the photosensitive region, and the read signal charges are transferred to the first accumulation region in response to a first field transfer pulse. Thereafter, after a second integration time setting pulse has been applied, in response to a second field shift (FS) pulse, signal charges are read from photosensitive pixels of even ordinal numbers $2n$ $(n=1, 2, \ldots)$ counted from above in the vertical direction of the photosensitive region, and the read signal charges are transferred to the second accumulation region in response to a second field transfer pulse.

In the case of the above-mentioned transfer, there exists a time difference between the integration time (from the integration time setting pulse to the first FS pulse) and the signal charge accumulation time (from the integration time setting pulse to the second FS pulse), which is equal to a time difference between the first and second FS pulses. Therefore, the influence of the time offset cannot be disregarded when the signal charge accumulation time (integration time) becomes shorter than a predetermined value.

As described above, in the conventional solid-state image sensing devices, since signal charges are read by two charge detecting circuits for each field, where the integration time shorter than a predetermined time period is set, a big difference in image signal intensity is developed due to a difference in time between the lines or due to a difference in the signal charge accumulation time, with the result that there exists a problem in that the motion picture quality is deteriorated. For instance, here the assumption is made that the time difference between the above-mentioned first and second integration time setting pulses is equal to a 5-line horizontal transfer time (5H). In this case, if the integration time is 1/60 seconds, the picture quality is almost not degraded. However, the integration time is reduced down to about 1/5000 seconds which is, for example, obtained when a high speed electronic shutter is used, since the intensity of the obtained signal charge is low, the picture quality is markedly deteriorated. Further, since the S/N ratio decreases with decreasing accumulation quantity (integration value) of the signal charges of the first and second pixel groups, the picture quality is deteriorated accordingly.

SUMMARY OF THE INVENTION

Accordingly, it is the first object of the present invention to provide a solid-state image sensing device which is free from the picture quality deterioration caused by a time difference developed at the integration time start and according to the integration time interval.

Further, the other object of the present invention is to provide a method of driving the solid-state image sensing device, which can prevent the picture quality from being deteriorated.

According to the first aspect of the present invention, there is provided a solid-state image sensing device, comprising:

a photosensitive region having photosensitive pixels arranged two-dimensionally in row and column directions, for photoelectrically converting incident light into signal charges and accumulating the converted signal charges temporarily and respectively, and vertical transfer paths formed in the vicinity of the respective photosensitive pixels arranged in the column direction, for reading the signal charges and transferring the read signal charges in the column direction, respectively;

a first accumulation region formed at respective first ends of the vertical transfer paths formed in the photosensitive region and having cyclic transfer paths each composed of loop-shaped linked transfer stages;

a second accumulation region having transfer paths formed at respective second ends of the vertical transfer paths;

a first horizontal transfer path formed on the side of the first accumulation region opposite from said photosensitive region, for transferring the signal charges in the row direction;

a first charge detecting circuit disposed at an output terminal of said first horizontal transfer path, for detecting the signal charges transferred through said first horizontal transfer path;

a second horizontal transfer path formed on the side of the second accumulation region opposite from said photosensitive region, for transferring the signal charges in the row direction;

a second charge detecting circuit disposed at an output terminal of said second horizontal transfer path, for detecting the signal charges transferred through said second horizontal transfer path; and means for synthesizing the signal charges read from a first pixel group composed of the photosensitive pixels arranged in odd lines in said photosensitive region and the signal charges read from a second pixel group composed of the photosensitive pixels arranged in even lines in said photosensitive region.

According to the present invention, there is provided a method of driving a solid-state image sensing device, including:

a photosensitive region having photosensitive pixels arranged two-dimensionally in row and column directions, for photoelectrically converting incident light into signal charges and accumulating the converted signal charges temporarily and respectively, and vertical transfer paths formed in the vicinity of the respective photosensitive pixels arranged in the column direction, for reading the signal charges and transferring the read signal charges in the column direction, respectively;

a first accumulation region formed at respective first ends of the vertical transfer paths formed in the photosensitive region and having cyclic transfer paths each composed of loop-shaped linked transfer stages;

a second accumulation region having transfer paths formed at respective second ends of the vertical transfer paths;

a first horizontal transfer path formed on the side of the first accumulation region opposite from the photosensitive region, for transferring the signal charges in the row direction, the first horizontal transfer path having a first charge detecting circuit for converting the signal charges into electric signals at one end thereof; and a second horizontal transfer path formed on the side of the second accumulation region opposite from the photosensitive region, for transferring the signal charges in the row direction, the second horizontal transfer path having a second charge detecting circuit for converting the signal charges into electric signals at one end thereof;

wherein a first operation comprises the steps of:

transferring the signal charges read from a first pixel group composed of the photosensitive pixels arranged in odd lines along vertical direction in the photosensitive region to the first accumulation region;

transferring the signal charges read from a second pixel group composed of the photosensitive pixels arranged in even lines along vertical direction in the photosensitive region to the second accumulation region; and outputting the electric signals from the first and second charge detecting circuits, respectively; and wherein a second operation comprises the steps of:

transferring the signal charges read from a first pixel group composed of the photosensitive pixels arranged in odd lines along vertical direction in the photosensitive region and the signal charges read from a second pixel group composed of the photosensitive pixels arranged in even lines along vertical direction in the photosensitive region both to vertical transfer paths, respectively;

adding and synthesizing the signal charges at two photosensitive pixels adjacent to each other in two adjacent lines;

transferring the synthesized signal charges to the first or second charge detecting circuit through the first or second horizontal transfer path; and converting the synthesized signal charges into electric signals by the first or second charge detecting circuits; and wherein any one of the first and second operations can be selected according to conditions.

According to the present invention, when the illumination intensity of an object to be image-sensed is low or when the integration time of the signal charges is shorter than a predetermined time, the image signals obtained by the odd line pixels and those obtained by the even line pixels are synthesized, as occasion demands, to secure a necessary signal charge quantity, thus preventing the image quality from being deteriorated. In the above-mentioned synthesis, the signal charges transferred along two horizontal transfer paths are synthesized and further detected by charge detecting means. It is also possible to synthesize the signal charges when the signal charges are read from the photosensitive pixels to the vertical transfer path.

BRIEF DESCRIPTION OF THE DRAWINGS

In the attached drawings:

FIGS. 3A to 3C are timing charts showing a practical driving method of the solid-state image sensing device shown in FIG. 2;

FIGS. 4A to 4D are timing charts showing a driving method applied to the solid-state image sensing device of such a type that all the signal charges of the substrate are swept off (transferred out) before signal charge accumulation;

FIGS. 7A to 7C are timing charts showing a practical driving method of the solid-state image sensing device shown in FIG. 5;

FIGS. 8A to 8D are timing charts showing a driving method-applied to the solid-state image sensing device of such a type that all the signal charges of the substrate are swept off (transferred out) before signal charge accumulation;

DETAILED DESCRIPTION OF THE PREFERRED EMBODIMENTS

Embodiments of the present invention will be described hereinbelow with reference to the attached drawings.

Figure 1:
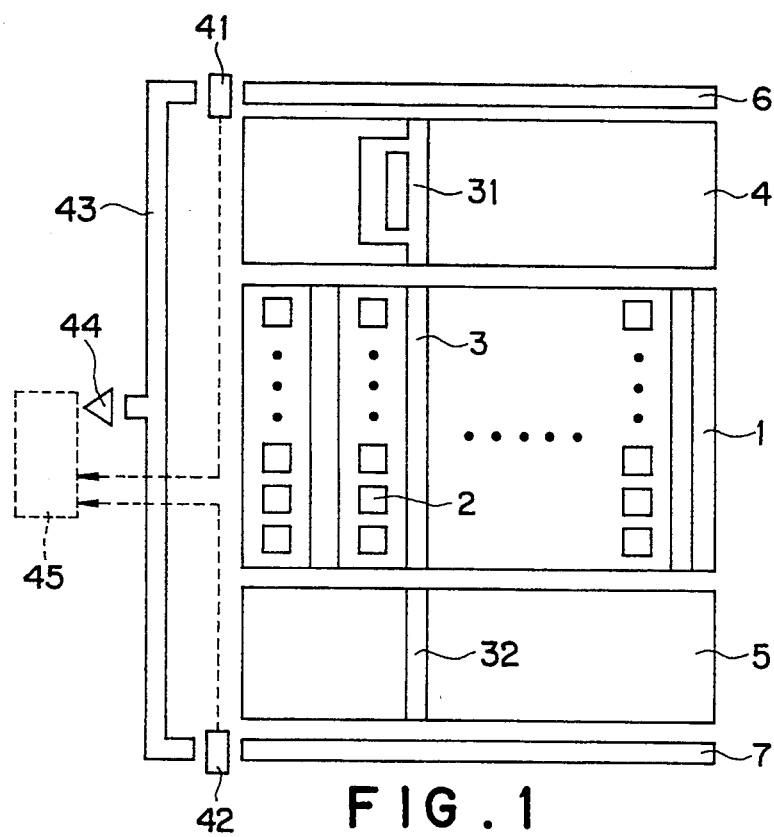
FIG. 1 is a plan view showing a structure of the solid-state image sensing device according to the present invention.

FIG. 1 shows an example of a solid-state image sensing device to which the driving method according to the present invention can be applied.

In a photosensitive region 1 of this solid-state image sensing device, photosensitive pixels 2 for photoelectrically converting incident light into signal charges respectively are arranged two-dimensionally in both the row direction and column directions. Further, vertical transfer paths 3 are formed between the two adjacent vertical photosensitive pixel columns each of which is composed of a group of photosensitive pixels arranged in vertical direction, respectively. Further, a single transfer stage of the vertical transfer path 3 is composed of two photosensitive pixels arranged adjacent to each other in the vertical direction. Further, a first accumulation region 4 and a second accumulation region 5 both for accumulating signal charges for one field are formed on both (upper and lower) sides of the photosensitive region 1. In these first and second accumulation regions 4 and 5, a plurality of vertical transfer paths 31 and 32 are arranged, respectively. These vertical transfer paths 31 and 32 are connected to the vertical transfer paths 3 of the photosensitive region 1, respectively. The respective vertical transfer path 31 of the first accumulation region 4 is a cyclic transfer path obtained by linking a plurality of transfer stages into a loop circuit so that the vertical arrangement order of the photosensitive pixels 2 can be changed in the photosensitive region 1.

In addition, a first horizontal transfer path 6 and a second horizontal transfer path 7 are formed on both the outer sides of the first and second accumulation regions 4 and 5, respectively (remote from the photosensitive region 1). The output terminals of the horizontal transfer paths 6 and 7 are connected to a charge transfer path 43 via floating gates 41 and 42, respectively. A third charge detecting circuit 44 is provided midway of the charge transfer path 43. Therefore, signal charges transferred along the first and second horizontal transfer paths 6 and 7 are read in analog fashion through the floating gates 41 and 42, respectively, and added on the charge transfer path 43, and then outputted through the third charge detecting circuit 44.

Here, the two floating gates 41 and 42 are used as charge detecting circuits which can detect the signal charges non-destructively. As with the other charge detecting circuits, there is known a method of detecting the charge on the basis of current spikes and a floating-junction type detecting circuit.

Further, although the odd-line signals and the even-line signals read by the floating gates 41 and 42, respectively are used in the same way as is usual, when the illumination intensity of an object to be image-sensed is low or when the accumulation time is short, it is possible to use synthesized signal charges detected by the third charge detecting circuit 44.

Further, as described later, in the solid-state image sensing device as shown in FIG. 1, it is also possible to provide switching means 45 for selectively outputting any one of the outputs of the first and second charge detecting circuits (the floating gates 41 and 42) and the third charge detecting circuit 44, as shown by dashed lines in FIG. 1.

The transfer operation of the solid-state image sensing device according to the present invention will be described hereinbelow.

The vertical blanking (VBL) periods and the horizontal blanking periods (HBL) develop alternately. Therefore, in the VBL periods, the vertical signal charges are transferred from the photosensitive pixels in the photosensitive region 1 to the vertical transfer paths 3 and further in the vertical direction along the vertical transfer paths 3. Here, the transfer sequence of the signal charges are changed by the cyclic transfer, as occasion demands. Thereafter, in the HBL periods, the signal charges are transferred in the horizontal direction to output the transferred signal charges to the outside of the device. As described above, it is possible to output all the signal charges to the outside independently within one field, by repeating the vertical charge transfer and the horizontal charge transfer within the two blanking periods. In this embodiment, since the signal charges are transferred in the vertical and horizontal directions by utilizing the blanking periods, it is possible to prevent the pulse for controlling the transfer operation from being mixed with the output signals in the signal charge reading period.

Figure 2:
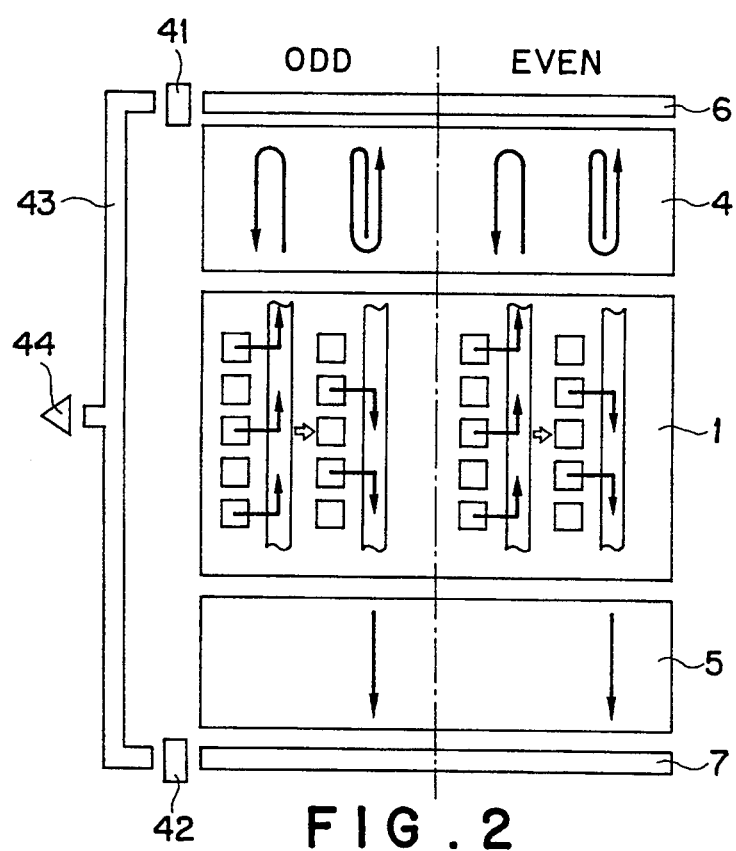
FIG. 2 is an illustration to help explain the method of driving the solid-state image sensing device shown in FIG. 1.

The method of driving the solid-state image sensing device shown in FIG. 1 will be described hereinbelow with reference to FIG. 2, in which the charge transfer operation is shown being classified according to the first (or odd) field and the second (even) field. First, in the first field, signal charges are read from the pixels arranged in the odd number lines, and then transferred to the first accumulation region 4 via the vertical transfer path. In this first accumulation region 4, the signal charges are accumulated in the reverse order along the cyclic transfer path. Successively, signal charges are read from the pixels arranged in the even number lines, and then transferred to the second accumulation region 5 via the vertical transfer path. Further, the signal charges are transferred from the first and second accumulation regions 4 and 5 to the horizontal transfer paths 6 and 7, simultaneously and respectively.

The transfer operation in the second field is quite the same as with the case of the first field.

The above-mentioned operation described in FIG. 2 will be described in further detail with reference to timing charts shown in FIGS. 3A to 3C.

After an integration time setting pulse 10 is applied at a time point t1, in response to a first FS pulse 11 applied at a time point t3 within a predetermined vertical blanking period VBL, charge signals are read from the (2n−1)th (n=1, 2, ...) photosensitive pixels of a first pixel group (V1) counted from above in the vertical direction of the photosensitive region 1, and then transferred to the first accumulation region 4 on the basis of the first field transfer pulse 14. Further, after an integration time setting pulse 12 is applied at a time point t2, in response to a second FS pulse 13 applied at a time point t4 within the predetermined vertical blanking period VBL, charge signals are read from the (2n)th (n=1, 2, ...) photosensitive pixels of a second pixel group (V3) counted from above in the vertical direction of the photosensitive region 1, and then transferred to the second accumulation region 5 on the basis of the second field transfer pulse 15. Thereafter, the charge signals read from these photosensitive pixels are transferred to the first and second horizontal paths 6 and 7, respectively. The signal charges transferred through these first and second horizontal transfer paths 6 and 7 are read by the floating gates 41 and 42 (serving as the first and second charge detecting circuits) provided on the ends of the transfer paths 6 and 7, respectively and further synthesized on the transfer path 43. The synthesized charge signals are read by the third charge detecting circuit 44.

The transfer operation of the second field is quite the same as with the case of the first field.

Further, there exists a time difference 16 between the two charge signals detected by the two charge detecting circuits 41 and 42 independently, as shown in FIG. 3A. In this embodiment, however, since the these two signals are added to obtain data of a half number of the photosensitive pixels arranged in the vertical direction, it is possible to effectively suppress the image deterioration due to time difference between the two. In addition, in the operation of this embodiment, the two signal accumulation times 45 and 46 (shown in FIGS. 3A and 3B) are equal to each other.

The transfer operation of the solid-state image sensing device of the type that all the charges are swept off (transferred out) to the semiconductor substrate before the integration starts will be described hereinbelow with reference to the timing charts shown in FIGS. 4A to 4D. The structure of this image sensing device is the same as that shown in FIG. 1.

In the first field, after an integration time setting pulse 17 is applied to a semiconductor substrate (an overflow drain under the pixels) at a time point t1, in response to the first FS pulse 18 applied at a time point t2 within a predetermined vertical blanking period VBL, charge signals are read from the (2n−11)th (n=1, 2, ...) photosensitive pixels of the first pixel group (V1) in the photosensitive region 1, and then transferred to the first accumulation region 4 on the basis of the first field transfer pulse 20. Successively, in response to the second FS pulse 19 applied at a time point t3 within the predetermined vertical blanking period VBL, charge signals are read from the (2n)th (n=1, 2, ...) photosensitive pixels of a second pixel group (V3) in the photosensitive region 1, and then transferred to the second accumulation region 5 on the basis of the second field transfer pulse 21. The transfer operation of the second field is quite the same as with the case of the first field.

Further, there exists a time difference 24 (which corresponds to a time difference between the signal accumulation times 22 and 23) between the two charge signals obtained by the two charge detecting circuits 41 and 42 independently. In this embodiment, however, since these two signals are added to obtain data of a half number of the photosensitive pixels arranged in the vertical direction, it is possible to effectively suppress the image deterioration due to time difference between the two.

In the solid-state image sensing device and the driving method according to the present invention as described above, since the signal charges for two lines are synthesized outside the photosensitive region, the signal charge reading operation is the same in both when signal charges are read from the odd number lines and when read from the even number lines of the photosensitive region.

Further, since the signal charges read from the odd number lines are added to the signal charges read from the even number lines on the transfer path, even if the integration time is short, it is possible to obtain signal charges having sufficient intensity, thus preventing the image quality from being deteriorated.

The signal charges as described above can also be synthesized on the vertical transfer path. The method of driving the solid-state image sensing device as described above will be described hereinbelow with reference to FIGS. 5 to 8.

Figure 5:
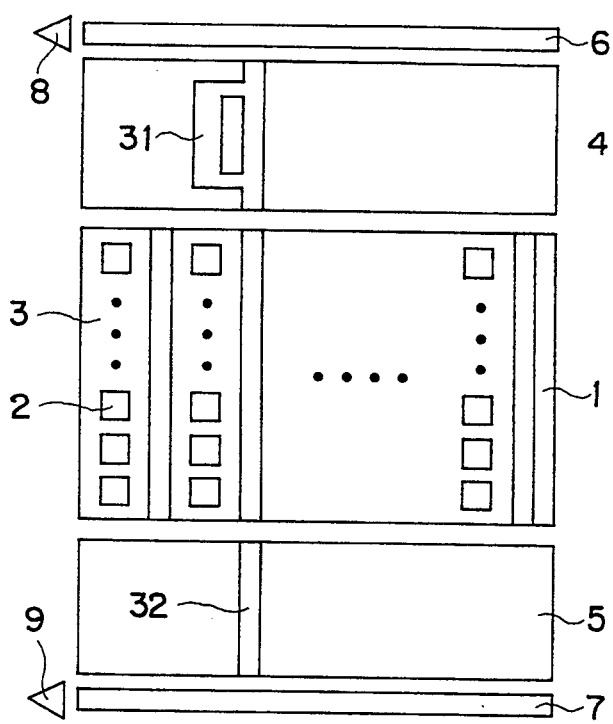
FIG. 5 is a plane view showing the solid-state image sensing device, to which the driving method according to the present invention is applied.

FIG. 5 shows an example of the solid-state image sensing device, to which the driving method as described above can be applied. FIG. 5 is basically the same as that shown in FIG. 1, except that the first and second charge detecting circuits 8 and 9 are provided at the ends of the first and second horizontal transfer paths 6 and 7, respectively without including the floating gates 41 and 42, the transfer path 43, and the third charge detecting circuit 44.

Figure 6:
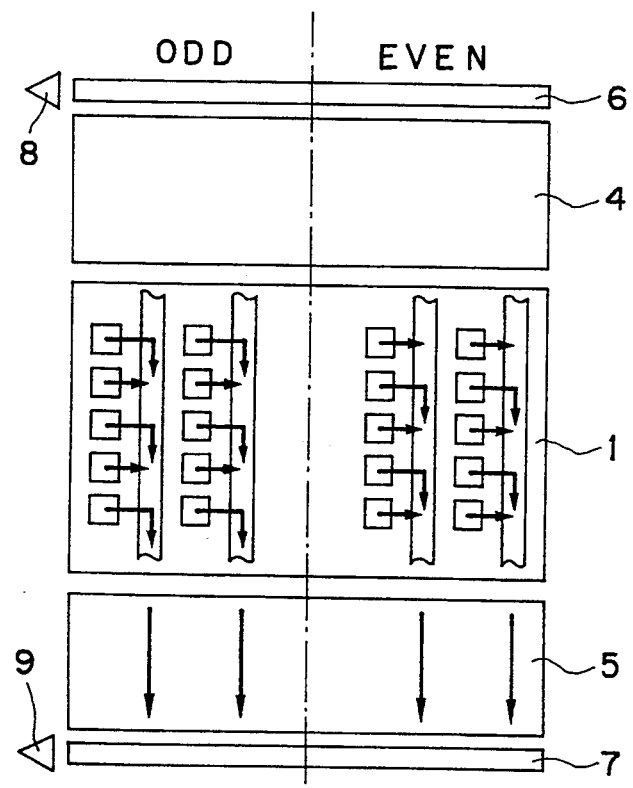
FIG. 6 is an illustration to help explain the method of driving the solid-state image sensing device shown in FIG. 5.

FIG. 6 is an illustration for assistance in explaining the signal charge synthesis on the vertical transfer path. In the first (odd) field, the charge signals of the odd number pixels counted from above are first transferred to the vertical transfer path. Thereafter, the transferred signal charges are further transferred along the vertical transfer path in the downward direction by one pixel pitch and simultaneously the signal charges of the even number pixels are transferred to the vertical transfer path for synthesizing both the transferred charge signals.

Further, in the second (even) field, the charge signals of the even number pixels counted from above are first transferred to the vertical transfer path. Thereafter, the transferred charge signals are further transferred along the vertical transfer path in the downward direction by one pixel pitch and simultaneously the signal charges of the odd number pixels are transferred to the vertical transfer path for synthesizing both the transferred charge signals.

Accordingly, in this embodiment, the synthesized charge signals are accumulated only in the second accumulation region 5, so that the synthesized charge signals can be outputted through only the horizontal transfer path 7.

Further, it is of course possible to transfer the charge signals in the upward direction.

The above-mentioned operation will be described in further detail with reference to timing charts shown in FIGS. 7A to 7C.

In the first (odd) field, after first and second integration time setting pulses 25 and 26 are applied at time points t1 and t2 respectively, in response to the first and second FS pulses 27 and 28 applied at a time point t3 within a predetermined vertical blanking period VBL, charge signals are read from the (2n−1)th (n=1, 2, ... ) photosensitive pixels of a first pixel group (V1) in the photosensitive region 1 and simultaneously from the (2n)th (n=1, 2, ... ) photosensitive pixels of a second pixel group (V3) in the photosensitive region 1. Further, two any given pixels adjacent in the vertical direction are added to obtain data of a half number of the photosensitive pixels arranged in the vertical direction. The added charge signals are transferred to the first and second horizontal transfer paths 6 and 7, and further outputted from the first and second charge detecting circuits 8 and 9. In the example shown in FIGS. 7A to 7D, the signal charges are outputted from the second charge detecting circuit 9 through the second horizontal transfer path 7. As described above, since the signal charges of two pixels in the photosensitive region 1 are added, it is possible to prevent the picture quality from being deteriorated due to the time difference.

In the second (even) field, the combination of the two pixels to be added is changed; that is, two pixels adjacent to each other on the opposite sides can be added.

Further, in this embodiment, although the first and second integration time setting pulses 25 and 26 are applied at two different time points t1 and t2, respectively, it is also possible to apply these two pulses at the same time.

The transfer operation of the solid-state image sensing device of the type that all the charges are swept off (transferred out) to the semiconductor substrate before the integration starts will be described hereinbelow with reference to the timing charts shown in FIGS. 8A to 8D.

At a time point t1, an integration time setting pulse 34 is applied to a semiconductor substrate (on which the solid-state image sensing device is formed) to sweep out (transfer out) the residual charges. In response to the first and second FS pulses 35 and 36 applied at a time point t2 within a predetermined vertical blanking period VBL, charge signals are read from the (2n−1)th (n=1, 2, ... ) photosensitive pixels of a first pixel group (V1) in the photosensitive region 1 and simultaneously from the (2n)th (n=1, 2, ... ) photosensitive pixels of a second pixel group (V3) in the photosensitive region 1. The charge signals of two pixels adjacent to each other in the vertical direction are added, and then the added charge signals are transferred to any one of the first and second accumulation regions 4 and 5. In this example, the added signal charges are transferred to the second accumulation region 5. Since the two pixels adjacent to each other in the vertical direction are added, it is possible to suppress the picture quality from being deteriorated due to a difference between the two charge accumulation times. Further, in the succeeding (even) field, the combination of the two added pixels is changed, and a similar operation is repeated.

In the embodiment shown in FIGS. 5 to 8, by changing the driving methods, it is possible to select the first operation such that the signal charges are read from the first and second pixel groups, respectively and independently or the second operation such that the signal charges of the two adjacent pixels are added and then synthesized.

For instance, by comparing the integration time with a predetermined time, it is possible to output the signal charges independently when the integral time is longer than a predetermined integral time, and to output the synthesized signal charges when the integral time is shorter than the predetermined integral time. As described above, in this embodiment, it is possible to prevent the picture quality from being deteriorated due to a time offset or a time difference in the signal charge accumulation time in the case of a short integration time, as when a motion picture is outputted. Further, when the luminance intensity is insufficient and thereby the signal charge intensity is lower than a predetermined level, it is possible to improve the S/N ratio of the image signals by the same driving method.

In the solid-state image sensing device according to the present invention, the first operation or the second operation can be selected in accordance with the following criteria (although not limited only thereto):

(1) The first operation is selected in the ordinary operation, and the second operation is selected when the integration time is shorter than a predetermined value, for prevention of the deterioration in picture quality. For instance, in the case of the embodiment shown in FIGS. 3A to 3C, the time difference 16 is (t4−t3). On the other hand, the integration time 45 or 46 between when the integration time setting pulse 10 or 12 is applied to when the FS pulse 11 or 13 is applied is (t3−t1) or (t4−t2). Accordingly, if (t3−t1) or (t4−t2) is equal to or longer than (t4−t3), the first operation is selected; and if (t3−t1) or (t4−t2) is shorter than (t4−t3), the second operation is selected. Further, in the case where the time difference is a time interval corresponding to the five line horizontal transfer time, the integration time of 1/1000 seconds is longer than this time difference, but the integration time of 1/5000 seconds is shorter than this time difference. Therefore, if the integration time is 1/5000 seconds, the second operation must be selected.

(2) When the integration quantity of the transferred signal charges is small, the S/N ratio is also deteriorated. Therefore, in this case, the second operation must be selected. In other words, the first operation is selected in the ordinary operation, but the second operation is selected only when the integration value of the signal charges is reduced below a predetermined value (e.g., 200 mV of the standard signal set value). When the second operation is selected, since a difference in accumulation value of the signal charges can be reduced, it is possible to reduce the deterioration in picture quality.

In order to select the first operation, for instance, a timing difference is provided between the FS pulses 11 and 13 applied to the first and second pixel groups respectively, as shown in FIGS. 3A and 3B. Further, in order to select the second operation, for instance, the FS pulses 27 and 28 applied to the first and second pixel groups, respectively, are determined at the timing at which the two adjacent pixels can be added, and further these two FS pulses are applied, simultaneously.

Figure 9:
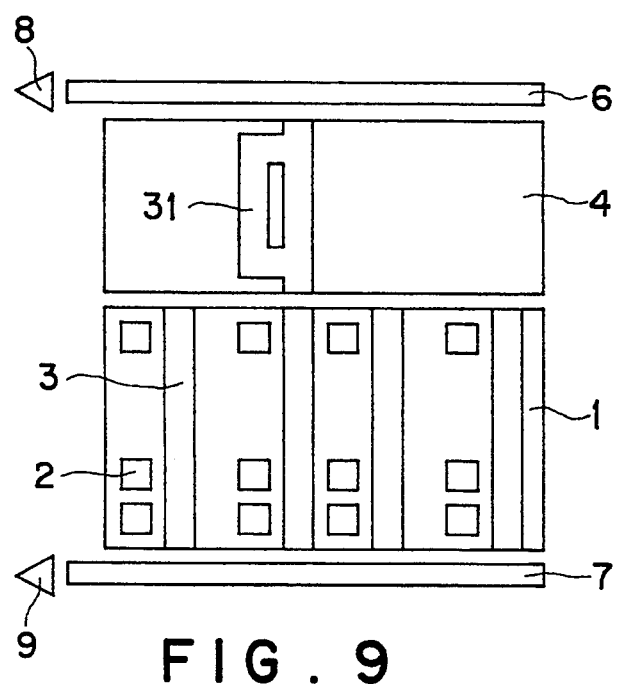
FIG. 9 is a plane view showing anther type of the solid-state image sensing device, to which the present invention can be applied.
Figure 10:
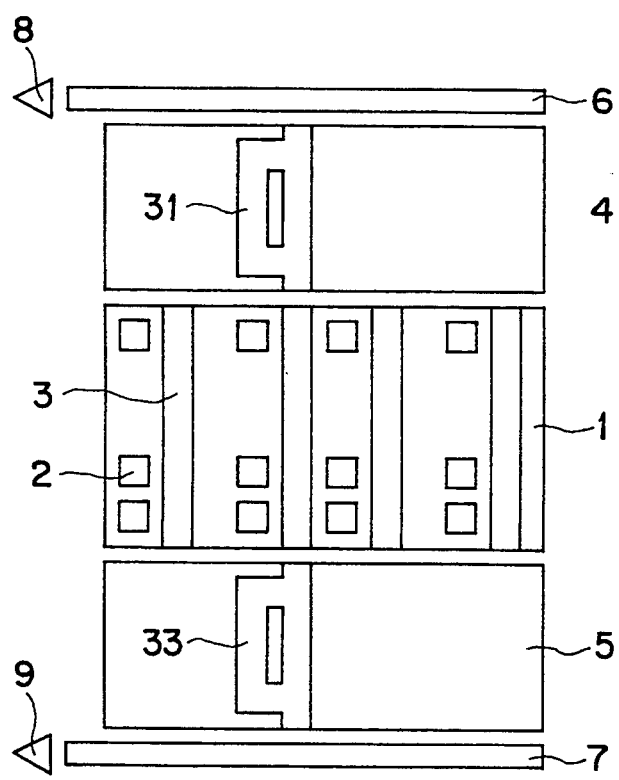
FIG. 10 is a plane view showing the other type of the solid-state image sensing device, to which the present invention can be applied.

Further, the driving method according to the present invention can be applied to other solid-state image sensing devices of the types as shown in FIGS. 9 and 10.

The solid-state image sensing device shown in FIG. 9 is basically the same as that shown in FIG. 5, except that the second horizontal transfer path 7 is provided under the photosensitive region 1, without forming the accumulation region. In this embodiment, since the accumulation region under the photosensitive region 1 can be eliminated on condition that the odd and even field charges are synthesized on the vertical transfer path, it is possible to minimize the device size.

The solid-state image sensing device shown in FIG. 10 has such a feature that a cyclic transfer paths are formed on two accumulation regions 4 and 5 provided on both sides of the photosensitive region 1, respectively. In more detail, the first accumulation region 4 and the second accumulation region 5 both for accumulating the first field signal charges are provided on both sides of the photosensitive region 1, and a plurality of vertical transfer paths 31 and 33 are arranged in the first and second accumulation regions 4 and 5, respectively, so as to be connected to the vertical transfer paths 3 of the photosensitive region 1. In the vertical transfer paths 31 and 33, since the transfer path is formed as a cyclic transfer path having a plurality of transfer stages connected into a loop circuit, it is possible to change the vertical arrangement order of the photosensitive pixels in the photosensitive region 1.

In the cyclic transfer paths, the charges can be transferred in the clockwise direction or the counterclockwise direction and further in two mutually opposite directions alternately or cyclically. Further, it is also possible to disable the cyclic transfer in the cyclic transfer path. In other words, it is possible to select the most effective transfer method when the cyclic transfer path is used. Further, when the two-line output signals are added, it is possible to obtain video signals having a double dynamic range and a high vertical resolution.

As described above, in the solid-state image sensing device according to the present invention, it is possible to prevent the picture quality from being deteriorated, by reducing the time offset or a time difference in the accumulation time of the signal charges caused when the integration time is shortened.

What is claimed is:

1. A solid-state image sensing device, comprising:
 a photosensitive region having photosensitive pixels arranged two-dimensionally in row and column directions, for photoelectrically converting incident light into signal charges and accumulating the converted signal charges temporarily and respectively, and vertical transfer paths formed in the vicinity of the respective photosensitive pixels arranged in the column direction, for reading the signal charges and transferring the read signal charges in the column direction, respectively;
 a first accumulation region formed at respective first ends of the vertical transfer paths formed in the photosensitive region and having cyclic transfer paths each composed of loop-shaped linked transfer stages;
 a second accumulation region having transfer paths formed at respective second ends of the vertical transfer paths;
 a first horizontal transfer path formed on the side of the first accumulation region opposite from said photosensitive region, for transferring the signal charges in the row direction;
 a first charge detecting circuit disposed at an output terminal of said first horizontal transfer path, for detecting the signal charges transferred through said first horizontal transfer path;
 a second horizontal transfer path formed on the side of the second accumulation region opposite from said photosensitive region, for transferring the signal charges in the row direction;
 a second charge detecting circuit disposed at an output terminal of said second horizontal transfer path, for detecting the signal charges transferred through said second horizontal transfer path; and
 means for synthesizing the signal charges read from a first pixel group composed of the photosensitive pixels arranged in odd lines in said photosensitive region and the signal charges read from a second pixel group composed of the photosensitive pixels arranged in even lines in said photosensitive region wherein said synthesizing means is provided outside of said photosensitive region and is a third charge detecting circuit connected to said first and second charge detecting circuits, for adding outputs of said first and second charge detecting circuits, transferring the added signal charge output, and converting the added signal charge output into an electric signal.

* * * * *